US006928608B2

(12) United States Patent
Peyser et al.

(10) Patent No.: US 6,928,608 B2
(45) Date of Patent: Aug. 9, 2005

(54) APPARATUS AND METHOD FOR ACCELERATING CYCLIC REDUNDANCY CHECK CALCULATIONS

(75) Inventors: Arye Peyser, Jerusalem (IL); Yaron Bar, Ra'anana (IL); Itai Katz, Rehovot (IL)

(73) Assignee: Optix Networks Ltd., Kfar Saba (IL)

( * ) Notice: Subject to any disclaimer, the term of this patent is extended or adjusted under 35 U.S.C. 154(b) by 428 days.

(21) Appl. No.: 10/216,796

(22) Filed: Aug. 13, 2002

(65) Prior Publication Data

US 2003/0061559 A1 Mar. 27, 2003

Related U.S. Application Data

(60) Provisional application No. 60/311,834, filed on Aug. 14, 2001.

(51) Int. Cl.[7] .............................................. H03M 13/15
(52) U.S. Cl. ...................................... 714/807; 714/757
(58) Field of Search ................................. 714/757, 758, 714/807

(56) References Cited

U.S. PATENT DOCUMENTS

| | | | | |
|---|---|---|---|---|
| 5,267,249 A | * | 11/1993 | Dong ........................... | 714/775 |
| 5,282,215 A | * | 1/1994 | Hyodo et al. ................ | 714/775 |
| 5,325,372 A | | 6/1994 | Ish-shalom | |
| 5,345,451 A | * | 9/1994 | Uriu et al. ................... | 714/775 |
| 5,390,196 A | | 2/1995 | Cecil et al. | |
| 5,619,516 A | * | 4/1997 | Li et al. ....................... | 714/807 |
| 5,691,997 A | * | 11/1997 | Lackey, Jr. .................. | 714/807 |
| 5,715,259 A | * | 2/1998 | Lee et al. .................... | 714/775 |
| 5,724,034 A | * | 3/1998 | Nielander et al. ............ | 341/94 |
| 5,724,368 A | | 3/1998 | Zook | |
| 5,764,876 A | * | 6/1998 | Yanagisawa et al. .......... | 714/6 |
| 5,778,013 A | * | 7/1998 | Jedwab ........................ | 714/807 |
| 5,956,102 A | * | 9/1999 | Lane ........................ | 348/425.4 |
| 6,029,186 A | | 2/2000 | Desjardins et al. | |
| 6,049,903 A | | 4/2000 | Nishimura | |
| 6,189,124 B1 | | 2/2001 | Glaise | |
| 6,560,742 B1 | * | 5/2003 | Dubey et al. ................ | 714/757 |
| 6,681,364 B1 | * | 1/2004 | Calvignac et al. .......... | 714/776 |
| 6,701,478 B1 | * | 3/2004 | Yang et al. .................. | 714/757 |
| 6,732,317 B1 | * | 5/2004 | Lo .............................. | 714/757 |

OTHER PUBLICATIONS

Lin et al., Error Control Coding—Fundamentals and Applications, 1983, Prentice–Hall, pp. 95–98.*

"Error Control Coding: An Introduction, " by Peter Sweeney, Prentice Hall 1991., Index only.

"Theory and Practice of Error Control Codes," by Richard E. Blahut, Addison–Wesley Publishing Company, Inc., 1983.

* cited by examiner

Primary Examiner—Stephen M. Baker
(74) Attorney, Agent, or Firm—Mark M. Friedman

(57) ABSTRACT

An apparatus and a method for accelerating Cyclic Redundancy Check (CRC) calculations. The apparatus includes a CRC circuit and an accelerator for accelerating the computation of the CRC code so that the CRC code is outputted immediately after the last bit of the input data stream is inserted to the CRC machine, thereby reducing the time required to compute the CRC calculation. The apparatus accelerates the CRC calculation by eliminating the need to append zeros to the input data stream.

15 Claims, 5 Drawing Sheets

| State | $R_4$ | $R_3$ | $R_2$ | $R_1$ | $S_1$ | $S_2$ | $S_3$ | $S_4$ |
|---|---|---|---|---|---|---|---|---|
| 0 | 0 | 0 | 0 | 0 | 0 | 0 | 0 | 0 |
| 1 | 0 | 0 | 0 | 1 | 1 | 1 | 0 | 0 |
| 2 | 0 | 0 | 1 | 0 | 0 | 1 | 1 | 0 |
| 3 | 0 | 0 | 1 | 1 | 1 | 0 | 1 | 0 |
| 4 | 0 | 1 | 0 | 0 | 0 | 0 | 1 | 1 |
| 5 | 0 | 1 | 0 | 1 | 1 | 1 | 1 | 1 |
| 6 | 0 | 1 | 1 | 0 | 0 | 1 | 0 | 1 |
| 7 | 0 | 1 | 1 | 1 | 1 | 0 | 0 | 1 |
| 8 | 1 | 0 | 0 | 0 | 1 | 1 | 0 | 1 |
| 9 | 1 | 0 | 0 | 1 | 0 | 0 | 0 | 1 |
| 10 | 1 | 0 | 1 | 0 | 1 | 0 | 1 | 1 |
| 11 | 1 | 0 | 1 | 1 | 0 | 1 | 1 | 1 |
| 12 | 1 | 1 | 0 | 0 | 1 | 1 | 1 | 0 |
| 13 | 1 | 1 | 0 | 1 | 0 | 0 | 1 | 0 |
| 14 | 1 | 1 | 1 | 0 | 1 | 0 | 0 | 0 |
| 15 | 1 | 1 | 1 | 1 | 0 | 1 | 0 | 0 |

| CLK NO. | $C_1$ | $C_2$ | $C_3$ | $C_4$ | $S_1$ | $S_2$ | $S_3$ | $S_4$ |
|---|---|---|---|---|---|---|---|---|
| 0 | 0 | 0 | 0 | 0 | 0 | 0 | 0 | 0 |
| 1 | 1 | 0 | 0 | 0 | 1 | 1 | 0 | 0 |
| 2 | 0 | 1 | 0 | 0 | 0 | 1 | 1 | 0 |
| 3 | 1 | 0 | 1 | 0 | 1 | 1 | 1 | 1 |
| 4 | 1 | 0 | 1 | 1 | 0 | 0 | 1 | 0 |
| 5 | 1 | 0 | 1 | 0 | 1 | 1 | 1 | 1 |

| CLK NO. | $C_{16}$ | $C_{15}$ | $C_{14}$ | $C_{13}$ | $C_{12}$ | $C_{11}$ | $C_{10}$ | $C_9$ | $C_8$ | $C_7$ | $C_6$ | $C_5$ | $C_4$ | $C_3$ | $C_2$ | $C_1$ |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 | 1 |
| 2 | 0 | 0 | 0 | 0 | 0 | 0 | 0 | 0 | 0 | 0 | 0 | 0 | 0 | 0 | 1 | 1 |
| 3 | 0 | 0 | 0 | 0 | 0 | 0 | 0 | 0 | 0 | 0 | 0 | 0 | 0 | 1 | 1 | 1 |
| 4 | 0 | 0 | 0 | 0 | 0 | 0 | 0 | 0 | 0 | 0 | 0 | 1 | 1 | 1 | 1 | 0 |
| 5 | 0 | 0 | 0 | 0 | 0 | 0 | 0 | 0 | 0 | 0 | 0 | 1 | 1 | 1 | 0 | 1 |

| CLK NO. | $S_{16}$ | $S_{15}$ | $S_{14}$ | $S_{13}$ | $S_{12}$ | $S_{11}$ | $S_{10}$ | $S_9$ | $S_8$ | $S_7$ | $S_6$ | $S_5$ | $S_4$ | $S_3$ | $S_2$ | $S_1$ |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 0 | 0 | 1 | 0 | 0 | 0 | 0 | 0 | 0 | 1 | 0 | 0 | 0 | 0 | 1 |
| 2 | 0 | 0 | 1 | 1 | 0 | 0 | 0 | 0 | 0 | 1 | 1 | 0 | 0 | 0 | 1 | 1 |
| 3 | 0 | 1 | 1 | 1 | 0 | 0 | 0 | 0 | 1 | 1 | 1 | 0 | 0 | 1 | 1 | 1 |
| 4 | 1 | 1 | 1 | 0 | 0 | 0 | 0 | 1 | 1 | 1 | 0 | 0 | 1 | 1 | 1 | 0 |
| 5 | 1 | 1 | 0 | 0 | 0 | 0 | 1 | 1 | 1 | 0 | 0 | 1 | 1 | 1 | 0 | 0 |

FIGURE 6

APPARATUS AND METHOD FOR ACCELERATING CYCLIC REDUNDANCY CHECK CALCULATIONS

This application is an application filed under 35 U.S.C. § 111(a). Claiming benefit pursuant to 35 U.S.C. §120 of the filing date of the Provisional Application Serial No. 60/311,834 filed on Aug. 14, 2001, pursuant to 35 U.S.C. § 111(b). The Provisional Application Ser. No. 60/311,834 is incorporated herein by reference for all it discloses.

REFERENCES

Patents
U.S. Pat. No. 5,325,372, January 1994, to Ish-Shaloin
U.S. Pat. No. 5,390,196, February 1995, to Cecil, et al.
U.S. Pat. No. 5,724,368, March 1998, to Zook
U.S. Pat. No. 6,029,186. February 2000, to DesJardins, et al.
U.S. Pat. No. 6,049,903, April 2000, to Nishimura
U.S. Pat. No. 6,189,124, February 2001, to Glaise

OTHER REFERENCES

1. "Error Control Coding: An Introduction," by Peter Sweeney, Prentice Hall 1991.
2. "Theory and Practice of Error Control Codes," by Richard E. Blahut, Addison-Wesley Publishing Company, Inc., 1983.

FIELD AND BACKGROUND OF THE INVENTION

1. Field of the Invention

The present invention relates to the generation of error detections code words, and more particularly to the generation of cyclic redundancy check (CRC) code words.

2. Description of the Related Art

In digital data transmission systems a sequence of binary information is delivered to a receiver across a transmission channel. Due to interference or impairments in the transmission channel, the binary data may be corrupted or changed while en route to a receiver. For this reason, error detection schemes are commonly employed to detect any differences between the originally transmitted data bits and the received data bits. In order to implement an error detection scheme, the bit stream that is transmitted is divided into a series of frame, each frame having a known group of bits. The frames can be of fixed or variable length, but in any case the receiver of the transmission can recover the frame boundaries. An error detection scheme then operates frame by frame.

Cyclic redundancy check (CRC) is a technique for error checking in data that has been transmitted by a digital data transmission system. It is often used as an error detection scheme because it is easy to implement and can detect a large class of errors. CRC is a checksum algorithm based on modulo-2 binary division.

The mathematics underlying CRC is known to those skilled in the art of error control coding and is described in detail in "Error Control Coding: An Introduction," by Peter Sweeney, Prentice Hall 1991, as well as in "Theory and Practice of Error Control Codes." by Richard E. Blahut, Addison-Wesley Publishing Company. Inc. 1983, which are hereby incorporated by reference, as if fully set forth herein.

The transmitter determines the CRC of a given frame by interpreting the data bits in the frame to be the coefficients of a binary field polynomial. For example, if there are K bits in a frame then the bits in the message are $C_{K-1}$, $C_{K-2}$, $C_{K-3}$, ... $C_2$, $C_1$, $C_0$, where $C_{K-1}$ is the first bit in the frame (transmitted first in time) and $C_0$ the last bit in the frame (transmitted last), each having a binary value of 1 or 0. This frame can thus be represented as a $(K-1)^{th}$ order binary field polynomial:

$$C(X) = C_{K-1}X^{K-1} + C_{K-2}X^{K-2} + \ldots + C_2X^2 + C_1X + C_0;$$

wherein, X is a bit delay operator and the $C_1$'s are the coefficients of the polynomial.

R zero bits are then appended to the frame creating an augmented frame with N=K+R bits. Appending R zeros to the frame is mathematically equivalent to multiplying the polynomial by $X^R$. The augmented polynomial is now $C(X)*X^R$, hence becoming a polynomial of the order $(N-1)^{th}$.

The CRC of the augmented frame is calculated by dividing $C(X)*X^R$ by a binary field polynomial of order R, G(X) known as the generator polynomial. The remainder of the polynomial division is another polynomial of order R−1, represented by R bits. Appending the bits to the original non-augmented frame is mathematically equivalent to adding the remainder to the augmented polynomial, forming a transmitted polynomial $$T(X) = C(X)*X^R + ((C(X)*X^R) \bmod G(X)).$$

The calculated CRC can be used to detect if errors occurred in the received data. The receiver receives the N bit frame, treats the bits as the coefficients of an $(N-1)^{th}$ order polynomial and divides this polynomial by the generator polynomial. The remainder of this division will be zero if no errors occurred during transmission. Both the transmitter and receiver must perform polynomial division.

The following is an example of the CRC process applied on the following parameters: the original frame (message) to be transmitted (M), is ten bits long and equals to "1010001101". The remainder (R), i.e., the CRC code to be appended to M, is five bits long. The generator polynomial (G) is a $5^{th}$ degree polynomial, for example the following may be used:

$$G(X) = X^5 + X^4 + X^2 + 1;$$

The binary representation of G(X) is "110101". The CRC process is as follows: first, adding to M five zeros and the divide by G, i.e. performing $$\frac{101000110100000}{110111}$$

The reminder, which is 1110, is appended to M. Therefore the resulting frame to be transmitted (T) equals to 1010001101 1110.

Reference is now made to FIG. 1 where an exemplary prior art CRC machine 100 is shown. CRC machine 100 uses registers 110-1 through 110-8 with feedback to implement the division of a frame of bits by an example generator polynomial:

$$G(X) = X^8 + X^6 + X^4 + X^2 + 1$$

Registers 110-1 through 110-8 are capable of performing delays of 1 bit per clock cycle. XOR logic gates 120 before registers 110-1, 110-2, 110-4, and 110-6 correspond to the non-zero coefficients of the G(X) divisor polynomial. Namely, the presence or the absence of a XOR gate corresponds to the presence or absence of a term in the generator polynomial G(X). Registers 110-1 through 110-8 would typically be initialized to the first eight bits of the input data stream that is $C_{N-1}$ to $C_{N-8}$ at the start of the polynomial division. Alternatively, the remainder can be initialized to zero and CRC machine 100 may be clocked an additional eight times to shift the first eight bits of the input data stream. Then, the frame bits are shifted at each iteration into the circuitry in the order $C_{N-9}$, $C_{N-10}$, $C_{N-11}$, $C_{N-12}$, ... $C_1$, $C_0$. At the end of the iterations, registers 110-1 through 110-8 contain the final remainder, which is shifted out as the CRC (at the transmitter) or used to determine if errors occurred (at the receiver). The number of iterations is equal to the frame length plus another 9 zeros (the number of zeros equivalent to the polynomial order).

The CRC checksum result is valid after a fixed delay from the time the last bit of the original input data stream was inserted to CRC machine. This fixed delay corresponds to the number of registers, which in turn corresponds with the order of the CRC. This delay deteriorates the efficiency of data transfer. The delay is caused by the sequence of zeroes, corresponding to the CRC order, that are appended to the data bits being transmitted and inserted to the CRC machine as required according to the CRC processing algorithms.

Therefore, there is thus a widely recognized need for and it would be advantageous to provide a method and apparatus that would calculate the CRC code immediately after the last bit of data is inserted into the CRC machine. That is, the provided apparatus would calculate the CRC without the insertion of the series of zeros and hence avoid the associated delay.

SUMMARY OF THE INVENTION

The present invention relates to an apparatus and a method for accelerating cyclic redundancy check (CRC) calculations. The apparatus comprises a CRC circuit and an accelerator, wherein the accelerator accelerates the computing of the CRC code. The provided apparatus outputs the CRC code immediately after inputting the last bit of the input data stream, enabling a significant reduction in the time required to output the CRC calculation. The apparatus accelerates the CRC calculation, by eliminating the need to append zeros to the original input data stream.

The present invention provides an apparatus for accelerating cyclic redundancy check (CRC) calculations, that comprises both a CRC circuit for calculating an intermediate CRC code from an input data stream to be transmitted; and an accelerator for generating CRC code from the intermediate CRC code.

The present invention also provides a method for accelerating a CRC calculation performed by a CRC circuit, comprising providing an accelerator etc.; calculating an intermediate CRC code from an input data stream, by means of the CRC circuit; and calculating a CRC code from the intermediate CRC code, by means of the accelerator.

BRIEF DESCRIPTION OF THE DRAWINGS

The principles and operation of a system and a method according to the present invention may be better understood with reference to the drawings, and the following description, it being understood that these drawings are given for illustrative purposes only and are not meant to be limiting, wherein:

FIG. 6 is an example of the use of the CRC-CCITT machine in accordance with one embodiment of the present invention.

DESCRIPTION OF THE PREFERRED EMBODIMENT

The present invention relates to an apparatus and a method for accelerating cyclic redundancy check (CRC) calculations.

The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Specifically, the present invention comprises a CRC circuit and an accelerator. The CRC circuit may be any type of CRC machine. The accelerator accelerates the computing of the CRC code. The provided apparatus outputs the CRC code immediately after inputting the last bit of the input data stream. As a result the time required to output the CRC calculation is reduced. The apparatus accelerates the CRC calculation, by eliminating the need to append zeros to the original input data stream.

Figure 1:
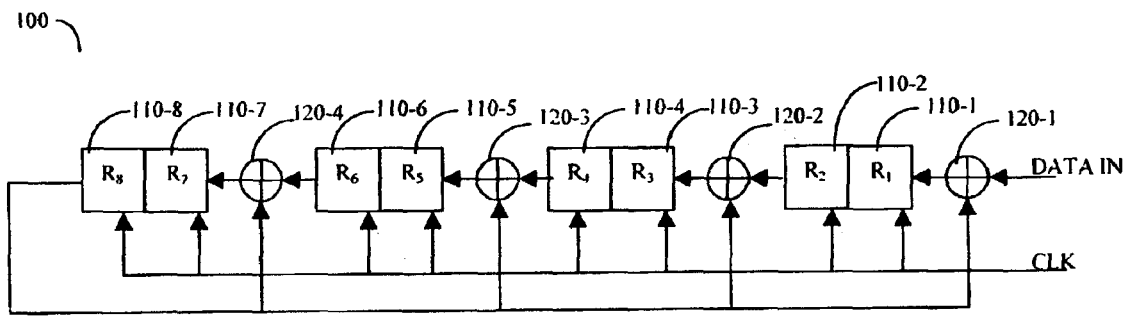
FIG. 1 is an illustration of a prior art CRC machine.
Figure 2:
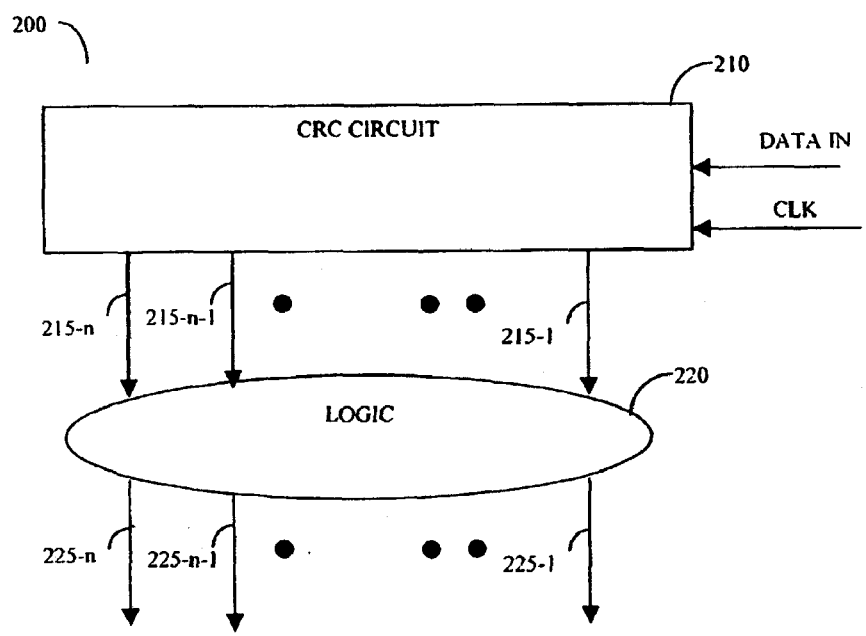
FIG. 2 is a schematic diagram of an apparatus of the present invention.

The principles and operation of a system and a method according to the present invention may be better understood with reference to the drawings and the accompanying description, it being understood that these drawings are given for illustrative purposes only and are not meant to be limiting, wherein:

Reference is now made to FIG. 2 where a schematic diagram of the provided apparatus 200 is shown, operating in accordance with the objective of the disclosed invention. Apparatus 200 includes a CRC circuit 210 and an accelerator 220. CRC circuit 210 may operate according to one of a plurality of techniques that are considered known in the art of error detection circuits. CRC circuit 210 is consistent with the CRC type, that is, the generator polynomial, which is taken to be of order "n". For example, for a CRC-8 machine with generator polynomial $G(X)=X^8+X^6+X^4+X^2+1$ (n=8), CRC circuit 210 may be implemented as shown in FIG. 1. Accelerator 220 includes logic circuitry aimed at performing CRC acceleration calculations. Each type of CRC machine requires a different implementation of accelerator 220. CRC circuit 210 is connected to accelerator 220 by means of outputs 215-1 through 215-$n$. The result of the CRC calculation, i.e., the final CRC code, is outputted on lines 225-1 through 225-$n$, where "n" is the order of the generator polynomial.

Accelerator 220 contains logic circuitry implementing a set of equations (i.e., logical expression). The equations prepared for each line 225-1 through 225-n are aimed at providing tile final CRC code respective of the specific line 225. For instance, the implementation of accelerator 220 may be accomplished through the following steps:

a) setting CRC circuit's 210 registers to an initial value;
b) inserting a series of zeros corresponding to the order of the CRC to CRC circuit 210;
c) registering the resultant CRC code respective of the initial value;
d) repeating steps a) through c) for all the possible initial values;
e) deriving a set of logic equations that represent the values of the CRC code as a function of the initial values;
f) implementing accelerator 220 using the set of logic equations found in step e).

The accelerator 220 can alternatively be described as having a plurality of logic gates selected and connected according to respective remainders obtained by dividing all possible initial data strings, equal in length, to a binary representation of a generator polynomial of the CRC circuit, by the binary representation.

A detailed example of this process is provided below. Using this process a person skilled in the art could implement any accelerated CRC machine, which provides the CRC code immediately after inputting the last bit of the input data stream.

Figures 3A, 3B:
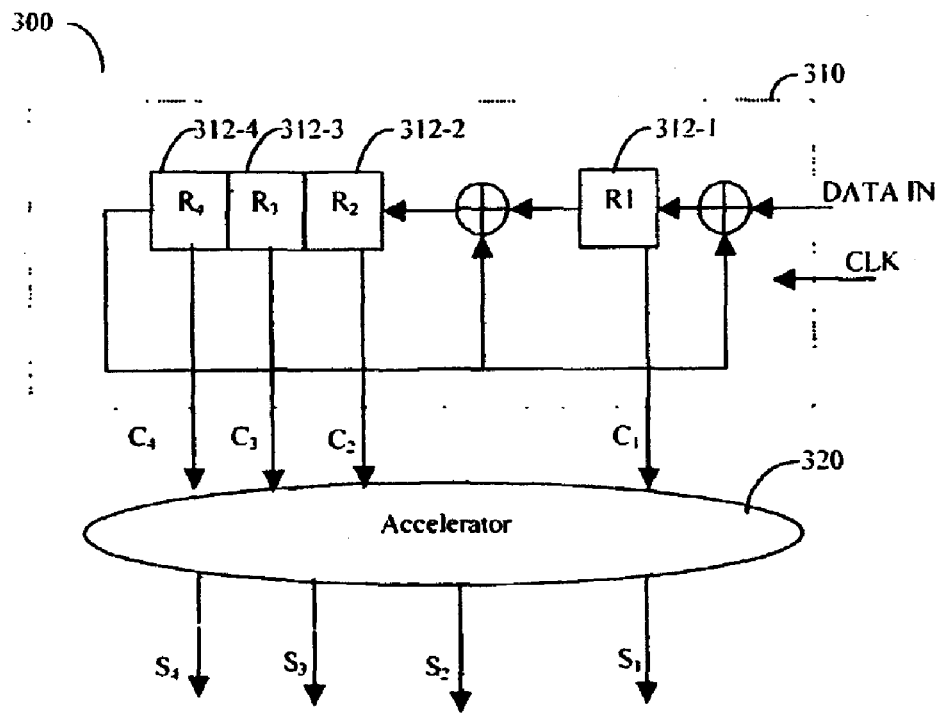
FIG. 3A is an exemplary block diagram of a CRC-4 machine in accordance with one embodiment of the present invention.
FIG. 3B is a table that holds the function to be implemented by the CRC-4 machine accelerator, in accordance with one embodiment of the present invention.

Reference is now made to FIG. 3A where an exemplary block diagram of a CRC-4 machine (hereinafter "apparatus") 300, implemented in accordance with one embodiment of the disclosed invention, is shown. Apparatus 300 improves the heretofore known CRC calculations, which are described in the prior art. Apparatus 300 includes a CRC circuit 310 and an accelerator 320. CRC circuit 310 is a CRC-4 machine, that utilizes the generator polynomial $G(X)=X^4+X+1$.

The implementation of accelerator 320 is performed as follows: first, for every possible initial value, the result of inserting four zeros to CRC circuit 310, is computed. The number of zeros inserted to apparatus 300 is equivalent to the order of the generator polynomial, in this case four. FIG. 3B shows the initial values to be set to registers 312-1 through 312-4 (columns R1, R2, R3, and R4), as well as their values after inserting the four zeros (columns S1, S2, S3, and S4). Next, equations for S1, S2, S3, and S4 as functions of C1, C2, C3, and C4 are derived. This may be performed using techniques known in the art, such as the Karnaugh technique, Boolean functions, and the others. The result equations that form accelerator 320 are:

$$S_1 = C_1 \oplus C_4 \quad (1)$$

$$S_2 = C_1 \oplus C_{4 \oplus C2} \quad (2)$$

$$S_3 = C_2 \oplus C_3 \quad (3)$$

$$S_4 = C_3 \oplus C_4 \quad (4)$$

Figures 3C, 4:
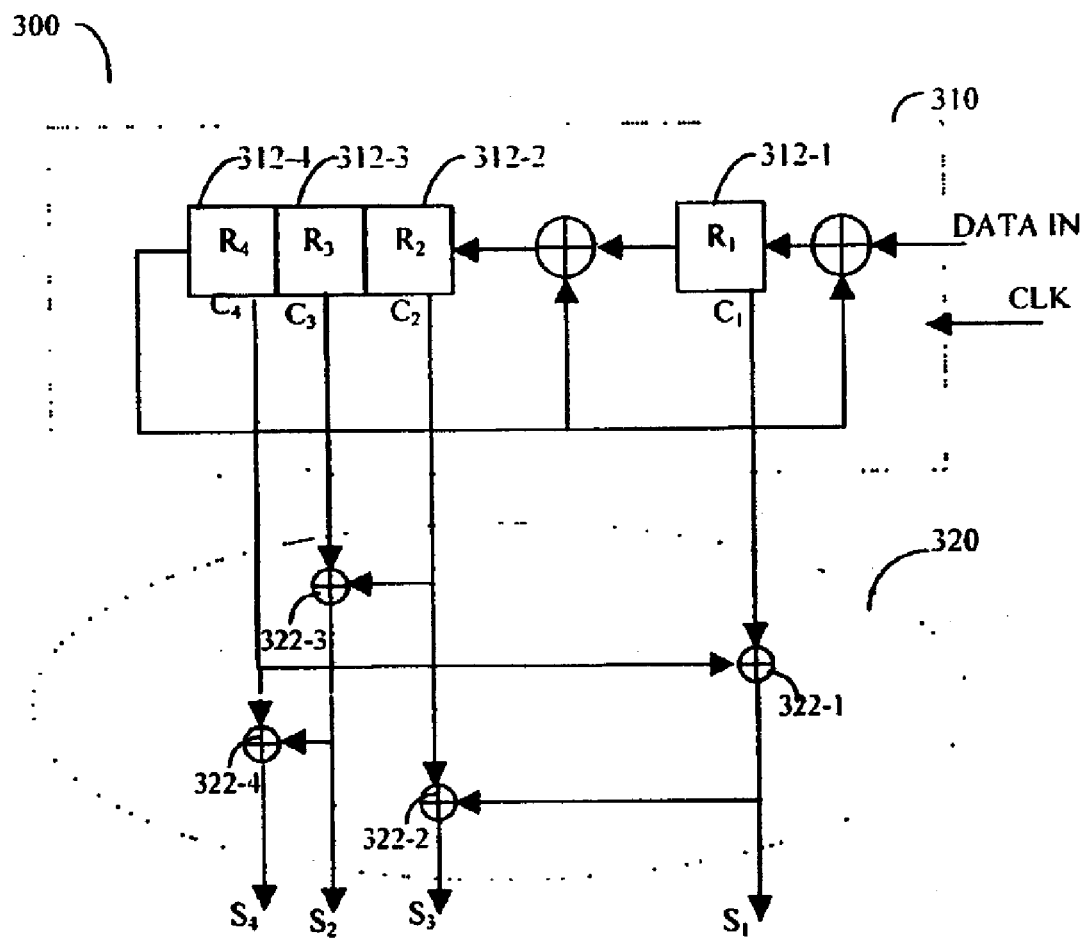
FIG. 3C is an exemplary block diagram of a CRC-4 machine in accordance with one embodiment of the present invention.
FIG. 4 is an example for tile use of in the CRC-4 machine in accordance with one embodiment of the present invention.

Accelerator 320, implementation as results from equations (1), (2), (3), and (4) shown in FIG. 3C. XOR gates 322-1, 322-2, 322-3, and 322-4 are consistent with equations (1), (2), (3) and (4) respectively.

Following is an example, showing an exemplary and non-limiting way to derive equation (1) using a Karnaugh map (see:http://www.ee.surrey.ac.uk/Projects/Labview/minimisation/karnaugh.html). A Karnaugh map, shown in Table 1, is filled out with "1"s where the value of "S1" equals to "1". Hence, cells 1, 3, 5, 7, 8, 10, 12, and 14 are set to "1". Equation (1) is the resulting equation as drawn from Table 1. The double-headed arrows and the ellipse represent two different groups, from which the equation is derived. A person skilled in the art would be fully familiar with this technique.

TABLE 1

| $C_4 C_3 \backslash C_2 C_1$ | 00 | 01 | 11 | 10 |
|---|---|---|---|---|
| 00 |  0 | 1  1 | 1  3 | 2 |
| 01 |  4 | 1  5 | 1  7 | 6 |
| 11 | 1  12 | 13 | 1  15 | 14 |
| 10 | 1  8 | 9 | 11 | 10 |

Reference is now made to FIG. 4 where an example for the use of apparatus 300 is shown. Apparatus 300, as illustrated in FIG. 3C, provides the CRC code immediately after the last bit of the input data steam (M) is inserted. In this example, M equals to "010110", since apparatus 300 is CRC-4 the generator polynomial is standardized to $X^4+X+1$ (i.e. 10011). FIG. 4 shows the content of registers 312-1 through 312-4 (columns C1, C2, C3, and C4), and accelerator's 320 outputs (columns S, S2, S3, and S4) after each clock. It can be noticed that apparatus 300 computes the CRC code in six clocks, as opposed to prior art approaches where an additional four clocks are required. For time critical or time constraint applications this is expected to be an invaluable technique.

Figure 5:
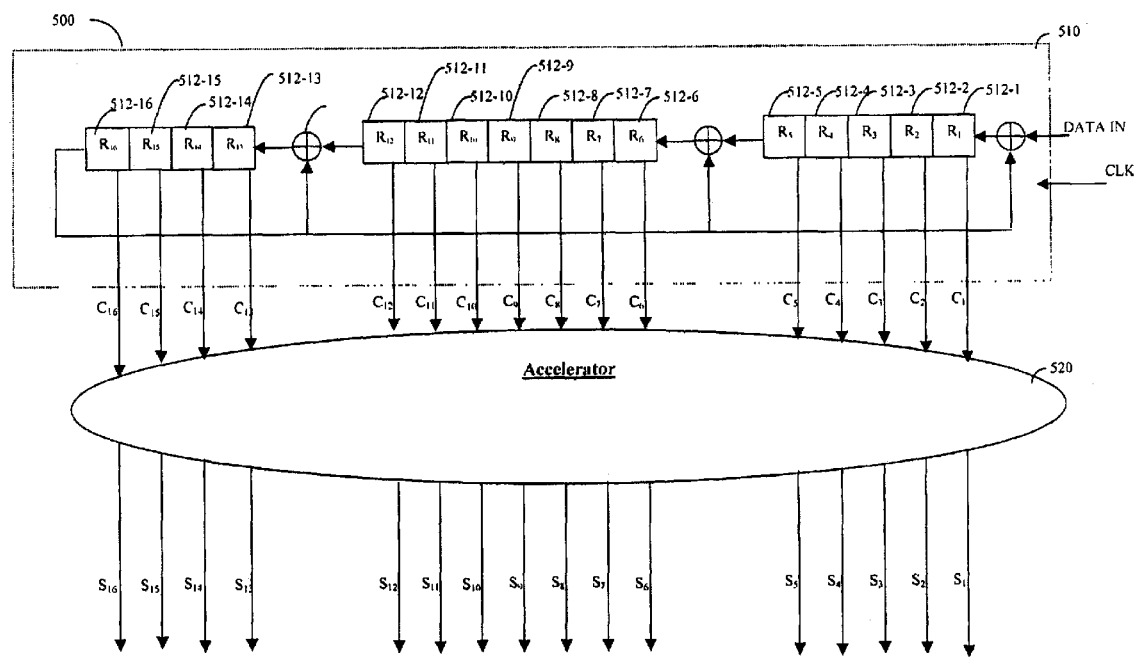
FIG. 5 is an exemplary block diagram of CRC-CCITT machine in accordance with one embodiment of the present invention.

Reference is now made to FIG. 5 where a block diagram of CRC-CCITT machine (hereinafter "apparatus") 500, in accordance with one embodiment of this invention is shown. Apparatus 500 is suitable for installation in a communication apparatus such as a modem for practicing a digital communication method. Apparatus 500 includes a CRC circuit 510 and an accelerator 520. CRC circuit 510 utilizes the generator polynomial $G(X)=1+X^5+X^{12}+X^{16}$ described in further detail in the International Telecommunication Union-Telecommunication Sector (CCITT) recommendation. Accelerator 520 is used to reduce the delay in calculating the CRC code, i.e., providing the CRC code immediately after the last bit of the input data stream is inserted. In prior art CRC-CCITT machines insertion of additional sixteen zeros (after the last bit of the input data stream) is required, in order to output the CRC code. Therefore no less then sixteen additional clock cycles are required to output the CRC code. The implementation of accelerator 520 is performed by following the steps described in greater detail above. The equations that form accelerator 520 are:

$$S1 = C1 \oplus C5 \oplus C9 \oplus C12 \oplus C13 \quad (1)$$

$$S2 = C2 \oplus C6 \oplus C10 \oplus C13 \oplus C14 \quad (2)$$

$$S3 = C3 \oplus C7 \oplus C11 \oplus C14 \oplus C15 \quad (3)$$

$$S4 = C4 \oplus C8 \oplus C12 \oplus C15 \oplus C16 \quad (4)$$

$$S5 = C5 \oplus C9 \oplus C13 \oplus C16 \quad (5)$$

$$S6 = C1 \oplus C5 \oplus C6 \oplus C9 \oplus C10 \oplus C12 \oplus C13 \oplus C14 \quad (6)$$

$$S7 = C2 \oplus C6 \oplus C7 \oplus C10 \oplus C11 \oplus C13 \oplus C14 \oplus C15 \quad (7)$$

$$S8 = C3 \oplus C7 \oplus C8 \oplus C11 \oplus C12 \oplus C14 \oplus C15 \oplus C16 \quad (8)$$

$$S9 = C4 \oplus C8 \oplus C9 \oplus C12 \oplus C13 \oplus C15 \oplus C16 \quad (9)$$

$$S10 = C5 \oplus C9 \oplus C10 \oplus C13 \oplus C14 \oplus C16 \quad (10)$$

$$S11 = C6 \oplus C10 \oplus C11 \oplus C14 \oplus C15 \quad (11)$$

$$S12 = C7 \oplus C11 \oplus C12 \oplus C15 \oplus C16 \quad (12)$$

$$S13 = C1 \oplus C5 \oplus C8 \oplus C9 \oplus C16 \quad (13)$$

$$S14 = C2 \oplus C6 \oplus C9 \oplus C10 \quad (14)$$

$$S15 = C3 \oplus C7 \oplus C10 \oplus C11 \quad (15)$$

$$S16 = C4 \oplus C8 \oplus C11 \oplus C12 \quad (16)$$

Accelerator 520 comprises a plurality of XOR gates that implement equations (1) through (16). Reference is now made to FIG. 6 where an example for the use of apparatus 500 is shown. Apparatus 500, as illustrated in FIG. 5, provides the CRC code after the last bit of the input data stream (M) is inserted. In this example, M equals to "011101". Since apparatus 500 is a CRC-CCITT machine, the generator polynomial is $$G(X) = 1 + X^5 + X^{12} + X^{16}$$

(i.e. "10001000000100001"). FIG. 6 shows the content of registers 312-1 through 312-16 (C1 through C16), and accelerator's 320 outputs S1 through S16 after each clock cycle. It can be noticed that apparatus 500 computes the CRC code in five clocks (equivalent to the length of M), as opposed to prior art approaches where an additional sixteen clock cycles are required It should be noted that a person skilled in the art could easily adapt the disclosed invention to develop any type of CRC machines.

The foregoing description of the embodiments of the invention has been presented for the purposes of illustration and description. It is not intended to be exhaustive or to limit the invention to the precise form disclosed. It should be appreciated that many modifications and variations are possible in light of the above teaching. It is intended that the scope of the invention be limited not by this detailed description, but rather by the claims appended hereto.

What is claimed is:

1. An apparatus for computing a CRC code for an input data stream, comprising: a CRC circuit, comprising at least a plurality of registers and logic gates, for processing the input data stream in accordance with a binary field polynomial; and an accelerator for applying logical operations to contents of said registers so as to output the CRC code substantially simultaneously with an entry of a last bit of the input data stream to said CRC circuit.

2. The apparatus of claim 1, wherein said CRC circuit further comprises at least one register and at least one XOR gate.

3. The apparatus of claim 1, wherein said accelerator includes at least one XOR gate.

4. The apparatus of claim 1, wherein said accelerator includes a plurality of logic gates selected and connected according to respective remainders obtained by dividing all possible initial data strings, equal in length, to a binary representation of a generator polynomial of said CRC circuit, by said binary representation.

5. The apparatus of claim 1, wherein determination of said logic gates and their respective connectivity is effected by steps including: a) setting said CRC circuit's registers to an initial value; b) inserting a series of zeroes corresponding to an order of said CRC code to said CRC circuit: c) registering the resultant CRC code in relation to said initial value; d) repeating steps a) through c) for all possible initial values; and e) deriving a set of equations that represent values of said CRC code as a function of said initial values.

6. The apparatus of claim 5, further comprising the step of: f) implementing said logic unit using said set of logic equations.

7. The apparatus of claim 1, further comprising a circuit for appending said CRC code to the input data stream.

8. The apparatus of claim 7, wherein said CRC code is appended to said input data stream immediately after inputting a last bit of said input data stream.

9. A method for accelerating a CRC calculation, comprising the steps of:
   i. providing an accelerator, said accelerator comprising at least a CRC circuit and a logic circuitry for implementing at least a set of equations;
   ii. calculating an intermediate CRC code from an input data stream, by means of said CRC circuit; and
   iii. calculating a CRC code from said intermediate CRC code, by means of said accelerator.

10. The method of claim 9, further comprising the step of outputting said CRC code immediately after inputting a last bit of said input data stream to the CRC circuit.

11. The method of claim 9, further comprising appending the CRC code to the input data stream.

12. The method of claim 9, wherein said intermediate CRC code is an output of the CRC circuit immediately after inputting said last bit of said input data stream to be transmitted.

13. The method of claim 9, wherein said input data stream includes a plurality of data bits.

14. The method of claim 9, wherein logic equations required for said accelerator calculation are generated as follows: a) setting the CRC circuit's registers to an initial value; b) inserting a series of zeroes corresponding to the order of the CRC code to the CRC circuit; c) registering resultant CRC code respective of said initial value; d) repeating steps a) through c) for all possible initial values; and e) deriving a set of equations that represent the values of said CRC code as a function of said initial values.

15. The method of claim 14 further comprising the step of:
f) implementing a logic unit using said logic equations.

* * * * *